US012610195B2

(12) United States Patent
Xiao et al.

(10) Patent No.: US 12,610,195 B2
(45) Date of Patent: Apr. 21, 2026

(54) MINIATURE SPEAKER

(71) Applicant: AAC Microtech (Changzhou) Co., Ltd., Changzhou (CN)

(72) Inventors: Bo Xiao, Changzhou (CN); Ronglin Linghu, Changzhou (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 202 days.

(21) Appl. No.: 18/418,364

(22) Filed: Jan. 22, 2024

(65) Prior Publication Data

US 2024/0340594 A1     Oct. 10, 2024

Related U.S. Application Data

(63) Continuation of application No. PCT/CN2023/086933, filed on Apr. 7, 2023.

(51) Int. Cl.
| | |
|---|---|
| *H04R 9/06* | (2006.01) |
| *H04R 7/12* | (2006.01) |
| *H04R 7/18* | (2006.01) |
| *H04R 9/02* | (2006.01) |
| *H05K 1/189* | (2026.01) |

(52) U.S. Cl.
CPC .............. *H04R 9/063* (2013.01); *H04R 7/12* (2013.01); *H04R 7/18* (2013.01); *H04R 9/025* (2013.01); *H05K 1/189* (2013.01); *H04R 2400/11* (2013.01); *H04R 2499/11* (2013.01); *H05K 2201/10083* (2013.01)

(58) Field of Classification Search
CPC ............ H04R 2400/11; H04R 2499/11; H04R 9/063; H04R 7/12; H04R 7/18; H05K 1/189
See application file for complete search history.

(56) References Cited

U.S. PATENT DOCUMENTS

| | | | |
|---|---|---|---|
| 2020/0245058 A1* | 7/2020 | Lee | H04R 9/025 |
| 2022/0174419 A1* | 6/2022 | Liang | H04R 9/025 |

\* cited by examiner

*Primary Examiner* — Sunita Joshi
(74) *Attorney, Agent, or Firm* — Wiersch Law Group

(57) ABSTRACT

A miniature speaker, and the miniature speaker includes: frame, and motor assembly and speaker assembly that are fixed to frame. Motor assembly includes vibrating unit and magnetic circuit unit sandwiched between vibrating unit and speaker assembly. The vibrating unit and magnetic circuit unit are flexibly connected in first direction and rigidly connected in second direction. The vibrating unit includes first voice coil, and vibrating unit is driven to vibrate along first direction under action of first voice coil and magnetic circuit unit. The speaker assembly includes second voice coil, motor assembly is driven to vibration along second direction under action of second voice coil and magnetic circuit unit, and first direction is perpendicular to second direction. An X-axis motor and Z-axis motor share magnetic circuit to realize vibration functions of motors in X and Z directions and provide hardware foundation for diversity of vibration signals applied to motors.

9 Claims, 4 Drawing Sheets

MINIATURE SPEAKER

TECHNICAL FIELD

The present invention belongs to the technical field of electronic devices, and in particular, to a miniature speaker.

BACKGROUND

A speaker is an important acoustic component of a portable electronic device, which is configured to complete conversion between an electrical signal and a sound signal and is an energy conversion device. A linear vibration motor is a motor and an important component of the portable electronic device, which is configured to realize a function of a vibration reminder.

Currently, in the related art, sound playback and vibration of the electronic device are completed by two independent devices, namely a speaker and a motor. As a result, overall assembly of the electronic device is complicated, and more structures occupy more internal space of the electronic device.

In addition, a solution has been proposed to combine a speaker and a vibrating motor into one, for example, the speaker and the motor share a same drive coil, and a sound diaphragm and a vibrator of the motor vibrate in a same direction. However, this may lead to formation of a single vibration signal, which is not conducive to diversified applications of speaker devices.

Therefore, there is a need to provide a new miniature speaker to solve the above problem.

SUMMARY

The present invention is intended to provide a miniature speaker to solve one of the technical problems existing in the prior art.

The present invention provides a miniature speaker, including: a frame, and a motor assembly and a speaker assembly that are fixed to the frame, the motor assembly including a vibrating unit and a magnetic circuit unit sandwiched between the vibrating unit and the speaker assembly;

the vibrating unit and the magnetic circuit unit are flexibly connected in a first direction and rigidly connected in a second direction;

the vibrating unit includes a first voice coil, and the vibrating unit is driven to vibrate along the first direction under the action of the first voice coil and the magnetic circuit unit; and the speaker assembly includes a second voice coil, the motor assembly is driven to vibration along the second direction under the action of the second voice coil and the magnetic circuit unit, and the first direction is perpendicular to the second direction.

As an improvement, the miniature speaker further includes a plurality of elastic connectors, a first end of each of the elastic connectors is connected to the magnetic circuit unit, and a second end of each of the elastic connectors is connected to the vibrating unit, so that the vibrating unit is suspended above the magnetic circuit unit.

As an improvement, each of the elastic connectors bends from the first end to the second end.

As an improvement, spring connectors are used as the elastic connectors.

As an improvement, the plurality of elastic connectors are symmetrically distributed on two sides of the vibrating unit and the magnetic circuit unit along the first direction.

As an improvement, the magnetic circuit unit includes an upper clamping plate, a lower clamping plate, a main magnet sandwiched between the upper clamping plate and the lower clamping plate, and auxiliary magnets arranged on two sides of the main magnet, and magnetic gaps are formed between the main magnet and the auxiliary magnets;

two sides of the upper clamping plate along a length direction thereof are arranged on the frame, and two sides of the upper clamping plate along the first direction are respectively connected to the first ends of the plurality of elastic connectors; and the first voice coil is suspended above the magnetic gaps, and at least part of the second voice coil is inserted into the magnetic gaps.

As an improvement, the upper clamping plate is provided, along the first direction, with two avoiding through slots corresponding to the magnetic gaps, and the first voice coil includes two sub-voice coils, the sub-voice coils being arranged in the corresponding avoiding through slots.

As an improvement, the vibrating unit further includes a mass block, and two sides of the mass block along the first direction are respectively connected to the second ends of the plurality of elastic connectors; and the two sub-voice coils are arranged on a side of the mass block facing the magnetic circuit unit.

As an improvement, the speaker assembly further includes a diaphragm and a diaphragm bracket, the diaphragm being fixed to the frame through the diaphragm bracket, and the diaphragm being wound around a side of the second voice coil away from the magnetic circuit unit.

As an improvement, the speaker assembly further includes two flexible printed circuit boards and two voice diaphragms;

the two flexible printed circuit boards and the two voice diaphragms being respectively arranged on two sides of the second voice coil along a length direction thereof, and the voice diaphragms being sandwiched between the frame and the flexible printed circuit boards.

The present invention provides a miniature speaker, including: a frame, and a motor assembly and a speaker assembly that are fixed to the frame. The motor assembly includes a vibrating unit and a magnetic circuit unit sandwiched between the vibrating unit and the speaker assembly. The vibrating unit and the magnetic circuit unit are flexibly connected in a first direction and rigidly connected in a second direction. The vibrating unit includes a first voice coil, and the vibrating unit is driven to vibrate along the first direction under the action of the first voice coil and the magnetic circuit unit. The speaker assembly includes a second voice coil, the motor assembly is driven to vibration along the second direction under the action of the second voice coil and the magnetic circuit unit, and the first direction is perpendicular to the second direction. An X-axis motor and a Z-axis motor of the present invention share a magnetic circuit unit to realize vibration functions of the motors in X and Z directions and provide a hardware foundation for diversity of vibration signals applied to the motors.

DESCRIPTION OF EMBODIMENTS

Figure 1:
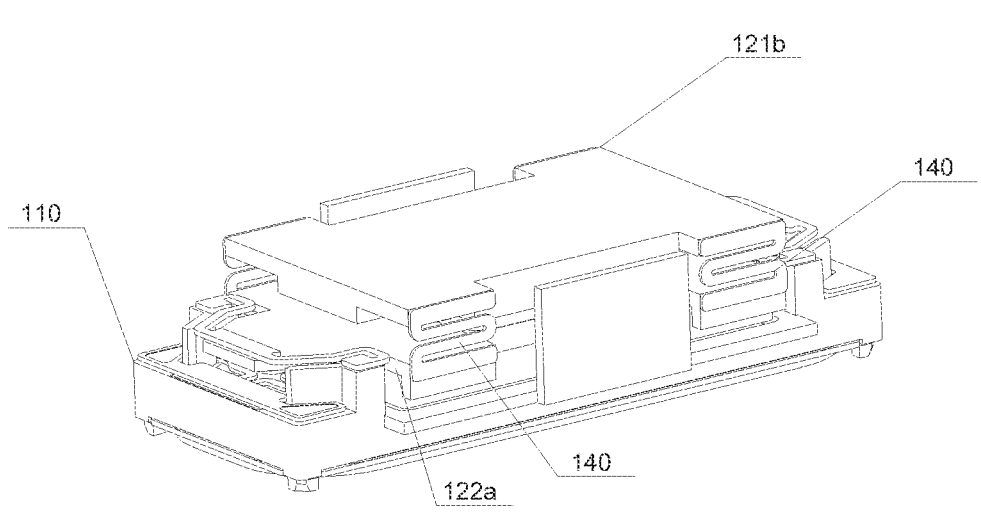
FIG. 1 is a schematic structural diagram of a miniature speaker according to an embodiment of the present invention.

In order to enable those skilled in the art to better understand the technical solutions of the present invention, the present invention will be described in further detail below in conjunction with the accompanying drawings and specific embodiments. Obviously, the described embodiments are some, but not all, of the embodiments of the present invention. Based on the described embodiments of the present invention, all other embodiments obtained by those of ordinary skill in the art without creative efforts fall within the protection scope of the present invention.

In some descriptions of the invention, unless otherwise expressly stated and limited, the terms "connect", "join", or "fix" and similar terms are not limited to physical or mechanical connections, but may include electrical connections, whether direct or indirect through intermediate media, or may be internal communication between two elements, or interaction between two elements. Moreover, the orientation or position relationships indicated by the terms such as "center", "longitudinal", "transverse", "length", "width", "thickness", "upper", "lower", "front", "rear", "left", "right", "vertical", "horizontal", "top", "bottom", "inner", and "outer" are based on the orientation or position relationships shown in the accompanying drawings and are intended only to represent a relative position relationship. When an absolute position of a described object changes, the relative position relationship may also change accordingly.

As shown in FIG. 1 to FIG. 5, the present invention provides a miniature speaker 100, including a frame 110, and a motor assembly 120 and a speaker assembly 130 that are fixed to the frame 110. The motor assembly 120 includes a vibrating unit 121 and a magnetic circuit unit 122 sandwiched between the vibrating unit 121 and the speaker assembly 130. The vibrating unit 121 and the magnetic circuit unit 122 are flexibly connected in a first direction and rigidly connected in a second direction. The vibrating unit 121 includes a first voice coil 121a, and the vibrating unit 121 is driven to vibrate along the first direction under the action of the first voice coil 121a and the magnetic circuit unit 122. The speaker assembly 130 includes a second voice coil 131, the motor assembly 120 is driven to vibration along the second direction under the action of the second voice coil 131 and the magnetic circuit unit 122, and the first direction is perpendicular to the second direction.

Figure 4:
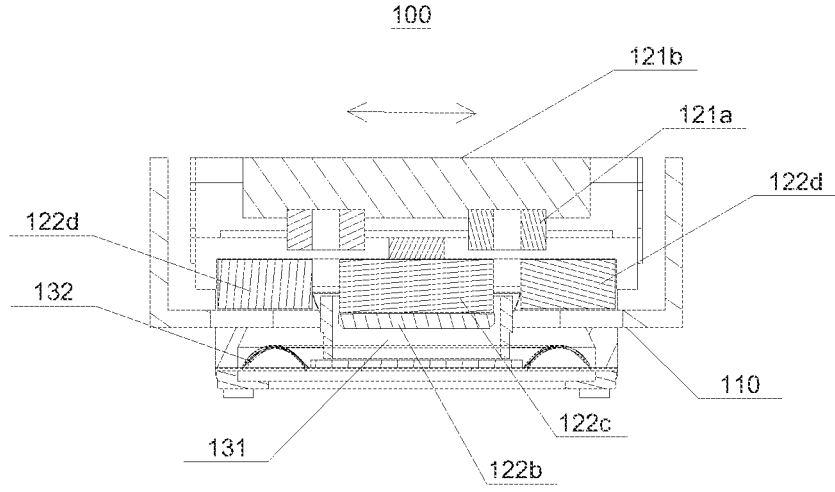
FIG. 4 is a schematic sectional view taken along a profile A-A in FIG. 3 according to the present invention.
Figure 5:
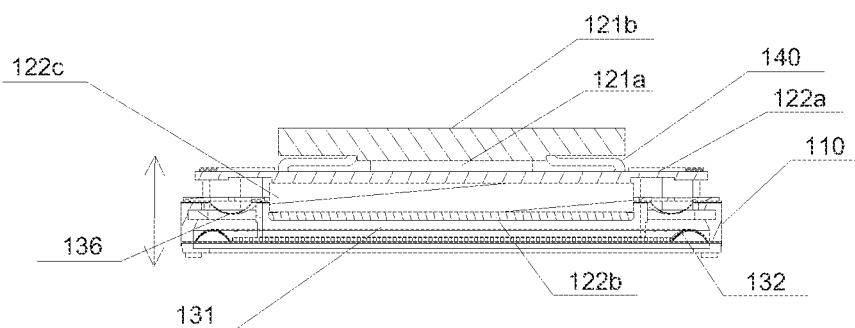
FIG. 5 is a schematic sectional view taken along a profile B-B in FIG. 3 according to the present invention.

In the embodiments of the present invention, the first direction refers to a direction along an X-axis, as indicated by the arrow in FIG. 4, and the second direction refers to a direction along a Z-axis, as indicated by the arrow in FIG. 5. That is, the vibrating unit vibrates along an X-axis direction to form an X-axis motor vibration system, and the motor assembly vibrates along a Z-axis direction to form a Z-axis motor vibration system. An X-axis motor and a Z-axis motor share a magnetic circuit unit to realize vibration functions of the motors in X and Z directions and provide a hardware foundation for diversity of vibration signals applied to the motors.

Further, as shown in FIG. 1 to FIG. 5, the miniature speaker 100 further includes a plurality of elastic connectors 140, a first end of each of the elastic connectors 140 is connected to the magnetic circuit unit 122, and a second end of each of the elastic connectors 140 is connected to the vibrating unit 121, so that the vibrating unit 121 is suspended above the magnetic circuit unit 122. That is, the magnetic circuit unit 122 and the vibrating unit 121 are connected through the elastic connector 140. The elastic connector 140 is flexibly connected in the first direction and plays a role of flexible vibration in the first direction. The elastic connector 140 is rigidly connected in the second direction to prevent interference between the magnetic circuit unit and the vibrating unit.

Figure 2:
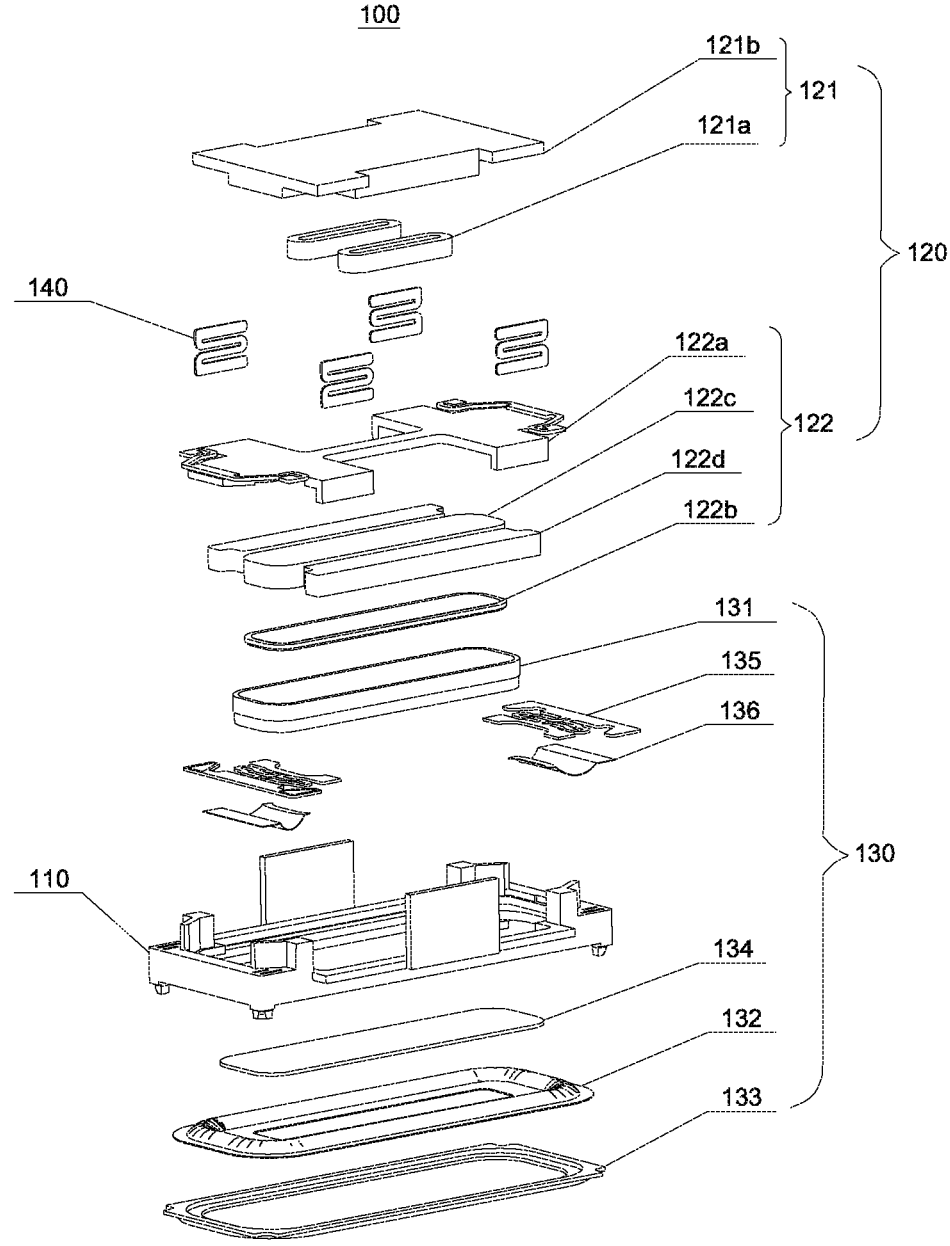
FIG. 2 is an exploded view of the miniature speaker according to another embodiment of the present invention.
Figure 3:
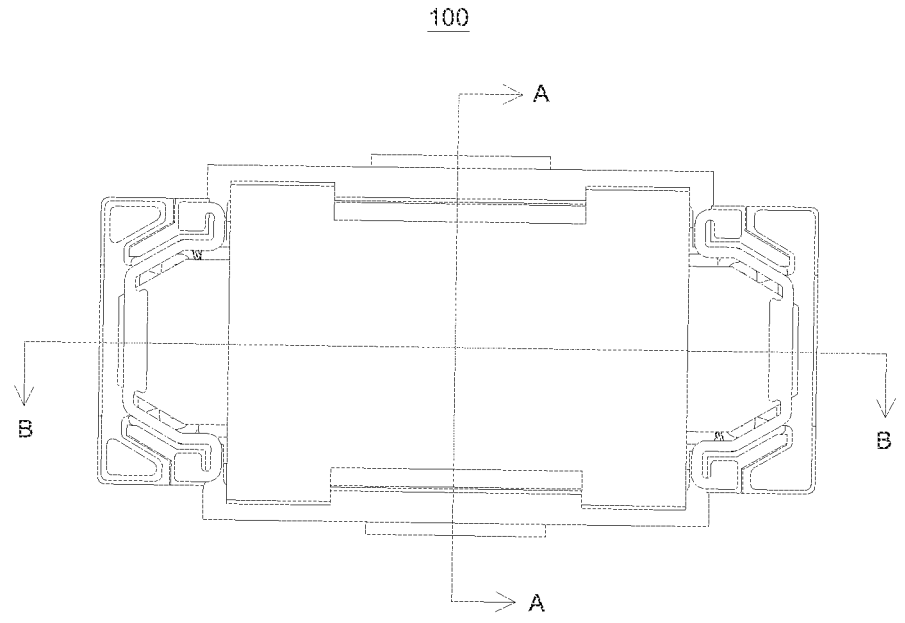
FIG. 3 is a top view of the miniature speaker according to another embodiment of the present invention.

Specifically, in the embodiments of the present invention, each of the elastic connectors bends from the first end to the second end. For example, a spring connector is used. Referring to FIG. 2, a cross section thereof is "W"-shaped. That is, the spring connector acts as a vibrating spring leaf in the X-axis direction In the present invention, based on the elastic connector, a force on the vibrating unit in the second direction is along a plane direction of the elastic connector, which is a pulling force and is difficult to cause the elastic connector to deform in a plane, while a force on the vibrating unit in the first direction is a bending force, which forms a moment perpendicular to the plane of the elastic connector. The vibrating unit is prone to deformation.

Specifically, in the embodiments of the present invention, the plurality of elastic connectors are symmetrically distributed on two sides of the vibrating unit and the magnetic circuit unit along the first direction.

Specifically, as shown in FIG. 1 to FIG. 5, the miniature speaker 100 of the present invention includes four elastic connectors 140. Two elastic connectors 140 are located on sides of the vibrating unit 121 and the magnetic circuit unit 122 along width directions thereof (i.e., the first direction), and the other two elastic connectors 140 are located on the other sides of the vibrating unit 121 and the magnetic circuit unit 122 along the width directions thereof.

Furthermore, as shown in FIG. 1 to FIG. 5, the magnetic unit 122 includes an upper clamping plate 122a, a lower clamping plate 122b, a main magnet 122c sandwiched between the upper clamping plate 122a and the lower clamping plate 122b, and auxiliary magnets 122d arranged on two sides of the main magnet 122c, and magnetic gaps are formed between the main magnet 122c and the auxiliary magnets 122d. That is, one magnetic gap is formed between the main magnet 122c and the auxiliary magnet 122d on one side, and the other magnetic gap is formed between the main magnet 122c and the auxiliary magnet 122d on the other side.

Still referring to FIG. 1 and FIG. 5, two sides of the upper clamping plate 122a along a length direction thereof are arranged on the frame 110, and two sides of the upper clamping plate 122a along the width direction thereof (i.e., the first direction) are respectively connected to the first ends of the plurality of elastic connectors 140. The first voice coil 121a is suspended above the magnetic gaps, and at least part of the second voice coil 131 is inserted into the magnetic gaps. In other words, the first voice coil is located above the magnetic gaps, and part of the second voice coil is inserted into part of the magnetic gaps from below. That is, the second voice coil is movably arranged on a side of the main magnet close to the lower clamping plate.

Specifically, in the embodiments of the present invention, as shown in FIG. 1 to FIG. 5, the upper clamping plate 122a is provided, along the first direction, with two avoiding through slots corresponding to the magnetic gaps, the first voice coil 121a includes two sub-voice coils, and each sub-voice coil is arranged in the corresponding avoiding through slot, so that each sub-voice coil is suspended above each magnetic gap.

Specifically, in the embodiments of the present invention, as shown in FIG. 1 and FIG. 2, the two sides of the upper clamping plate 122*a* along the width direction thereof are further provided with first fixed portions. The first fixed portions bend and extend downwards from end portions of the upper clamping plate 122*a*, so as to surround the main magnet 122*c* and the two auxiliary magnets 122*d* below the upper clamping plate 122*a* and cause the first ends of the elastic connectors 140 to be affixed to the first fixed portions.

In addition, a second voice coil is further provided below the magnetic gap. Therefore, as shown in FIG. 1 to FIG. 5, the lower clamping plate 122*b* of the present invention is only affixed below the main magnet 122*c*. In this way, at least part of the second voice coil 131 is wound around at least part of the main magnet 122*c*.

Furthermore, as shown in FIG. 1 to FIG. 5, the vibrating unit 121 of the present invention further includes a mass block 121*b*, and two sides of the mass block 121*b* along a width direction thereof (i.e., the first direction) are respectively connected to the second ends of the plurality of elastic connectors 140. The two sub-voice coils are arranged on a side of the mass block 121*b* facing the magnetic circuit unit 112. That is, the two sub-voice coils are arranged on the mass block 121*b* along the first direction.

Specifically, in the embodiments of the present invention, as shown in FIG. 1 and FIG. 2, one side of the mass block 121*b* along the width direction thereof is provided with a second fixed portion corresponding to the first fixed portion of the upper clamping plate 122*a*. The second fixed portion extends outwards from an end portion of the mass block, so that the second end of the elastic connector 140 is affixed to the second fixed portion.

In addition, in the embodiments of the present invention, a side of the mass block facing the magnetic circuit unit is provided with two fixed grooves corresponding to the two sub-voice coils, and each sub-voice coil is fixed in each fixed groove.

It is to be noted that numbers of the first voice coil, the magnetic gap, and the second voice coil are not specifically limited in the present invention, as long as the magnetic circuit unit formed by the main magnet and the auxiliary magnet is located between the first voice coil and the second voice coil, so that the two axial motors and the speaker assembly share a magnetic circuit system.

For the X-axis motor vibration system of the present invention, vibration mass is provided by the mass block and the first voice coil, a driving force is provided by the first voice coil, and a support system is provided by the elastic connector. For the Z-axis motor vibration system, vibration mass is provided by the X-axis motor vibration system and the magnetic circuit unit, a driving force is provided by the second voice coil, the magnetic circuit unit and the vibrating unit are connected through the elastic connectors, and the elastic connectors are rigidly connected in the second direction to prevent interference of the magnetic circuit unit with the X-axis motor vibration system, which function as vibrating spring leaves in the first direction.

In the embodiments of the present invention, when an audio current passes through the second voice coil and the first voice coil in a magnetic field, a magnetic field that changes the audio current is generated. The magnetic field interacts with the magnetic field of the magnetic circuit unit. The first voice coil vibrates in the first direction (the X-axis direction) and then drives the mass block to vibrate in the first direction, as shown in the X-axis direction indicated by the arrow in FIG. 4, and the second voice coil vibrates in the second direction (the Z-axis direction) and then drives the magnetic circuit unit and an X-axis vibrating unit to vibrate in the second direction, as shown in the Z-axis direction indicated by the arrow in FIG. 5.

In the present invention, based on the arrangement of the magnetic circuit unit between the first voice coil and the second voice coil, the magnetic circuit unit can be used as the vibration mass of the Z-axis motor, which eliminates a need to separately set the vibration mass of the Z-axis motor, and further saves costs and reduces total mass of the motor.

Furthermore, in the embodiments of the present invention, as shown in FIG. 1 to FIG. 5, the speaker assembly 130 further includes a diaphragm 132, a diaphragm bracket 133, and a dome 134. The diaphragm 132 is fixed to the frame 110 through the diaphragm bracket 133, and the diaphragm 132 is wound around a side of the second voice coil 131 away from the magnetic circuit unit 122. The dome 134 is located below the second voice coil 131 and connected to the second voice coil 131. That is, the dome 134 is fixed on a side of the diaphragm 132 facing the second voice coil 131. In other words, the motor assembly and the speaker assembly also share a magnetic circuit system, and energy during vibration of the motor assembly may be used to excite sound generation of the speaker assembly. At the same time, when the magnetic circuit unit drives the second voice coil to vibrate, the second voice coil drives the dome and the diaphragm to vibrate, thereby causing the diaphragm to vibrate and generate sound and realizing a sound-generating function of the speaker.

It is to be noted that the diaphragm, the diaphragm bracket, and the dome in the present invention may be formed separately or integrally, which is not specifically limited.

In the embodiments of the present invention, the diaphragm in the present invention is an annular diaphragm, and the diaphragm bracket is an annular bracket.

Furthermore, in the embodiments of the present invention, as shown in FIG. 1 to FIG. 5, the speaker assembly 130 further includes two flexible printed circuit boards 135 and two voice diaphragms 136. The two flexible printed circuit boards 135 and the two voice diaphragms 136 are respectively arranged on two sides of the second voice coil 131 along a length direction thereof. One flexible printed circuit board 135 and one diaphragm 136 are fixed to an end of the frame 110 along a length direction thereof, and the other flexible printed circuit board 135 and the other diaphragm 136 are fixed to the other end of the frame 110 along the length direction thereof. The voice diaphragms 136 are sandwiched between the frame 110 and the flexible printed circuit boards 135. The second voice coil 131 is driven by the magnetic circuit unit 122 to vibrate up and down, thereby driving the voice diaphragm 136 and the diaphragm 132 to vibrate up and down to generate sound. Moreover, the flexible printed circuit board 135 in this embodiment is configured to connect with an external circuit to realize data transmission.

The present invention provides a miniature speaker, which has the following beneficial effects.

Firstly, the speaker of the present invention combines a motor assembly and a speaker assembly, and the motor assembly and the speaker assembly share a magnetic circuit, thereby simplifying an assembly structure and realizing dual functions of sound playback and vibration.

Secondly, the speaker structure of the present invention also integrates an X-axis motor and a Z-axis motor to realize vibration in different directions, which, compared with vibration in a single direction, produces different vibration sensations, allowing the speaker to have diversified applications. Moreover, the X-axis motor and the Z-axis motor share a magnetic circuit, which has lower costs and saves space inside the electronic device.

Thirdly, the speaker of the present invention uses vibration mass of the X-axis motor as part of vibration mass of the Z-axis motor, thereby realizing effective separation of F0 of the Z-axis motor from F0 of the X-axis motor.

Fourthly, in the present invention, Z-axis rigid connections and X-axis flexible connections are realized by using the elastic connectors.

It may be understood that the above embodiments are only exemplary embodiments adopted to illustrate the principles of the present invention, but the present invention is not limited thereto. For those of ordinary skill in the art, various modifications and improvements can be made without departing from the spirit and essence of the present invention, and these modifications and improvements are also regarded as the protection scope of the present invention.

What is claimed is:

1. A miniature speaker, comprising: a frame, and a motor assembly and a speaker assembly that are fixed to the frame, wherein the motor assembly comprises a vibrating unit and a magnetic circuit unit sandwiched between the vibrating unit and the speaker assembly; wherein the vibrating unit and the magnetic circuit unit are flexibly connected in a first direction and rigidly connected in a second direction;

the vibrating unit comprises a first voice coil, and the vibrating unit is driven to vibrate along the first direction under action of the first voice coil and the magnetic circuit unit; and the speaker assembly comprises a second voice coil, the motor assembly is driven to vibration along the second direction under action of the second voice coil and the magnetic circuit unit, and the first direction is perpendicular to the second direction;

the miniature speaker further comprising elastic connectors, a first end of each of the elastic connectors is connected to the magnetic circuit unit, and a second end of the each of the elastic connectors is connected to the vibrating unit, so that the vibrating unit is suspended above the magnetic circuit unit.

2. The miniature speaker as described in claim 1, wherein each of the elastic connectors bends from the first end to the second end.

3. The miniature speaker as described in claim 2, wherein the elastic connectors are spring connectors.

4. The miniature speaker as described in claim 1, wherein the elastic connectors are symmetrically distributed on two sides of the vibrating unit and the magnetic circuit unit along the first direction.

5. The miniature speaker as described in claim 4, wherein the magnetic circuit unit comprises an upper clamping plate, a lower clamping plate, a main magnet sandwiched between the upper clamping plate and the lower clamping plate, and auxiliary magnets arranged on two sides of the main magnet, wherein magnetic gaps are formed among the main magnet and the auxiliary magnets;

two sides of the upper clamping plate along a length direction thereof are arranged on the frame, and two sides of the upper clamping plate along the first direction are respectively connected to the first ends of the elastic connectors; and the first voice coil is suspended above the magnetic gaps, and at least part of the second voice coil is inserted into the magnetic gaps.

6. The miniature speaker as described in claim 5, wherein the upper clamping plate is provided, along the first direction, with two avoiding through slots corresponding to the magnetic gaps, and the first voice coil comprises two sub-voice coils, each of the sub-voice coils is arranged in a corresponding avoiding through slot of the two avoiding through slots.

7. The miniature speaker as described in claim 6, wherein the vibrating unit further comprises a mass block, and two sides of the mass block along the first direction are respectively connected to second ends of the elastic connectors; and the two sub-voice coils are arranged on a side of the mass block facing the magnetic circuit unit.

8. The miniature speaker as described in claim 1, wherein the speaker assembly further comprises a diaphragm and a diaphragm bracket, the diaphragm is fixed to the frame through the diaphragm bracket, and the diaphragm is wound around a side of the second voice coil away from the magnetic circuit unit.

9. The miniature speaker as described in claim 8, wherein the speaker assembly further comprises two flexible printed circuit boards and two voice diaphragms;

the two flexible printed circuit boards and the two voice diaphragms are respectively arranged on two sides of the second voice coil along a length direction thereof, and the voice diaphragms are sandwiched between the frame and the flexible printed circuit boards.

* * * * *